(12) United States Patent
Fabinski et al.

(10) Patent No.: US 7,522,203 B2
(45) Date of Patent: Apr. 21, 2009

(54) ELECTRONIC SERIALIZATION OF IMAGE SENSORS

(75) Inventors: Robert P. Fabinski, Rochester, NY (US); Laurence J. Lobel, Brockport, NY (US)

(73) Assignee: Eastman Kodak Company, Rochester, NY (US)

( * ) Notice: Subject to any disclaimer, the term of this patent is extended or adjusted under 35 U.S.C. 154(b) by 1205 days.

(21) Appl. No.: 10/676,688

(22) Filed: Oct. 1, 2003

(65) Prior Publication Data

US 2005/0073598 A1    Apr. 7, 2005

(51) Int. Cl.
*H04N 5/335*    (2006.01)

(52) U.S. Cl. .................................. 348/294; 348/299

(58) Field of Classification Search ............... 348/86, 348/87, 241, 243, 294, 302, 180, 189; 438/57
See application file for complete search history.

(56) References Cited

U.S. PATENT DOCUMENTS

2002/0114526 A1*    8/2002    Dennis ..................... 382/232

\* cited by examiner

*Primary Examiner*—Tuan V Ho
*Assistant Examiner*—Selam T Gebriel
(74) *Attorney, Agent, or Firm*—Peyton C. Watkins

(57) ABSTRACT

An image sensor includes a substrate having a plurality of photosensitive sites for capturing an image and a plurality of additional photosensitive sites adjacent the image capturing photosensitive sites in which there is no image capture; and a digital signal embedded in one or more of the additional photosensitive sites for the purpose of identification.

4 Claims, 5 Drawing Sheets

ELECTRONIC SERIALIZATION OF IMAGE SENSORS

FIELD OF THE INVENTION

The invention relates generally to the field of image sensors and, more particularly, to such image sensors having an embedded signal therein for identifying the particular manufacturer, die location and the like.

BACKGROUND OF THE INVENTION

As is well known in the art, image sensors include a plurality of pixels for capturing an electronic representation of an image. Typically, a plurality of sensors is manufactured on one wafer, and the wafer is then cut so that each sensor has its own individual silicon substrate.

During manufacturing, it is desirable to know the spatial location of the wafer of one sensor in relation to the original uncut wafer since performance can be affected by location. In this regard, manufacturers typically test the sensors after the cutting process and knowing the precise location assists test personnel in calibration, future manufacturing, and the like. Obviously, manual tagging is labor intensive, prone to error due to misplaced and lost tags and the like.

Consequently, a need exists for having a sensor in which the sensor location in relation to the original uncut wafer is embedded in the sensor for efficient testing and manufacturing.

SUMMARY OF THE INVENTION

The present invention is directed to overcoming one or more of the problems set forth above. Briefly summarized, according to one aspect of the present invention, the invention resides in an image sensor comprising a substrate having a plurality of photosensitive sites for capturing an image and a plurality of additional photosensitive sites; and a digital signal embedded in one or more of the additional photosensitive sites for the purpose of identifying individually or in any combination particular manufacturer, lot, wafer, and/or position on the wafer during manufacture of the image sensor.

These and other aspects, objects, features and advantages of the present invention will be more clearly understood and appreciated from a review of the following detailed description of the preferred embodiments and appended claims, and by reference to the accompanying drawings.

ADVANTAGEOUS EFFECT OF THE INVENTION

The present invention has the advantage of having an embedded signal in the sensor that identifies lot location and the like.

DETAILED DESCRIPTION OF THE INVENTION

Figure 1:
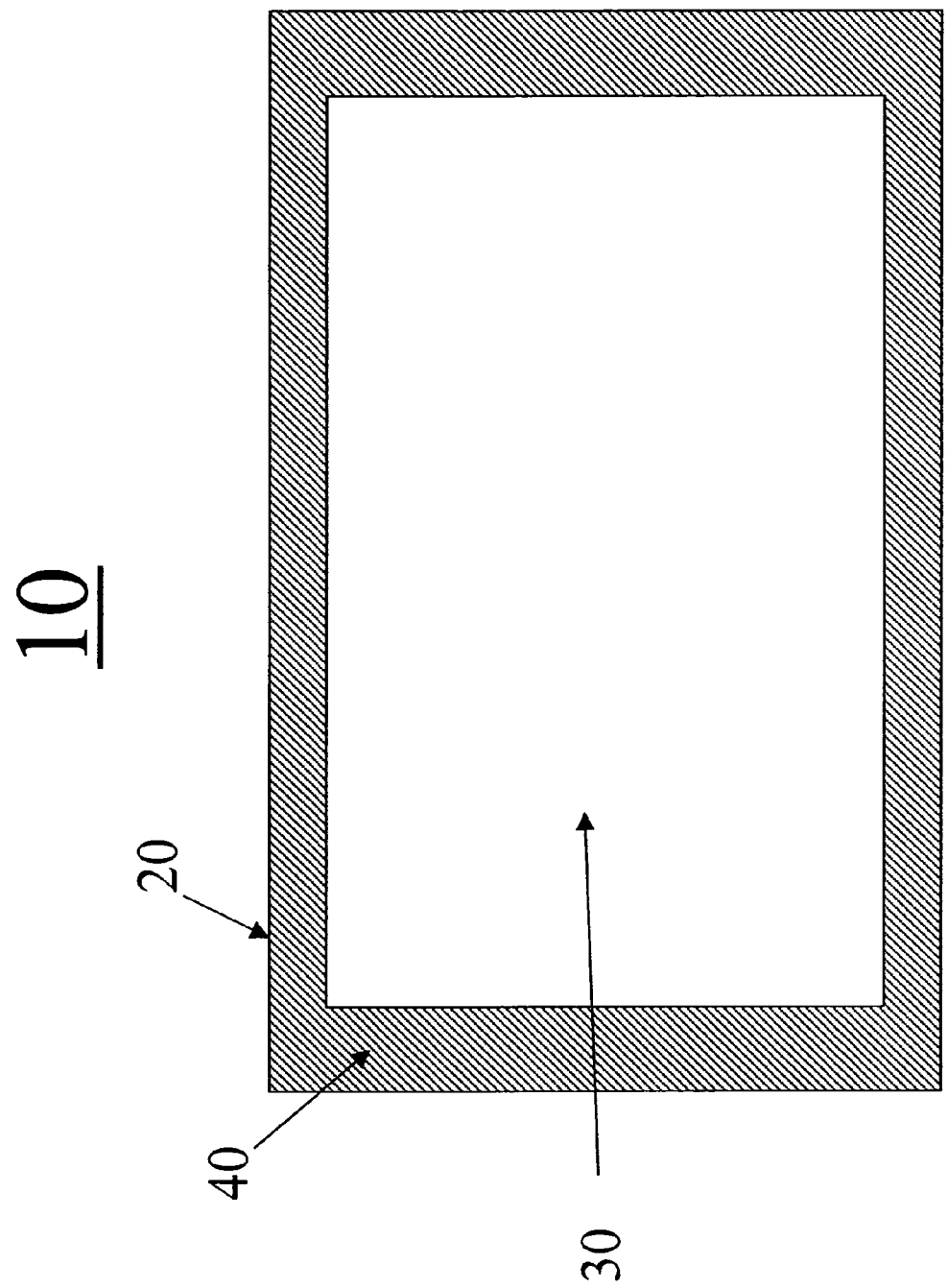
FIG. 1 is a top view of an image sensor of the present invention.

Referring to FIG. 1, there is shown the image sensor 10 of the present invention. The sensor 10 includes a substrate 20 in which a plurality of pixels 30 is disposed within a predetermined portion of the substrate 20. This is commonly referred to as the active area. As is well known in the art, the pixels 30 capture incident light that is converted into a charge packet for forming an electronic representation of the image. The substrate 20 includes a non-active area 40 surrounding the active area in which an identification code is embedded, as will be described in detail hereinbelow.

It is instructive to note at this point that the manufacture of the active area will not be described in detail herein since it can be done by any well-known method and apparatus. Now referring to FIGS. 2 and 3, during manufacture of the original wafer, a metal plate 50 having one or more apertures or openings 60 at predetermined locations is placed covering all or a portion of the non-active portion of the wafer. The particular locations of the apertures 60 are varied from sensor to sensor so that the unique pattern eventually embedded in the sensor corresponding to the one or more aperture locations is unique to that particular sensor.

Figure 2:
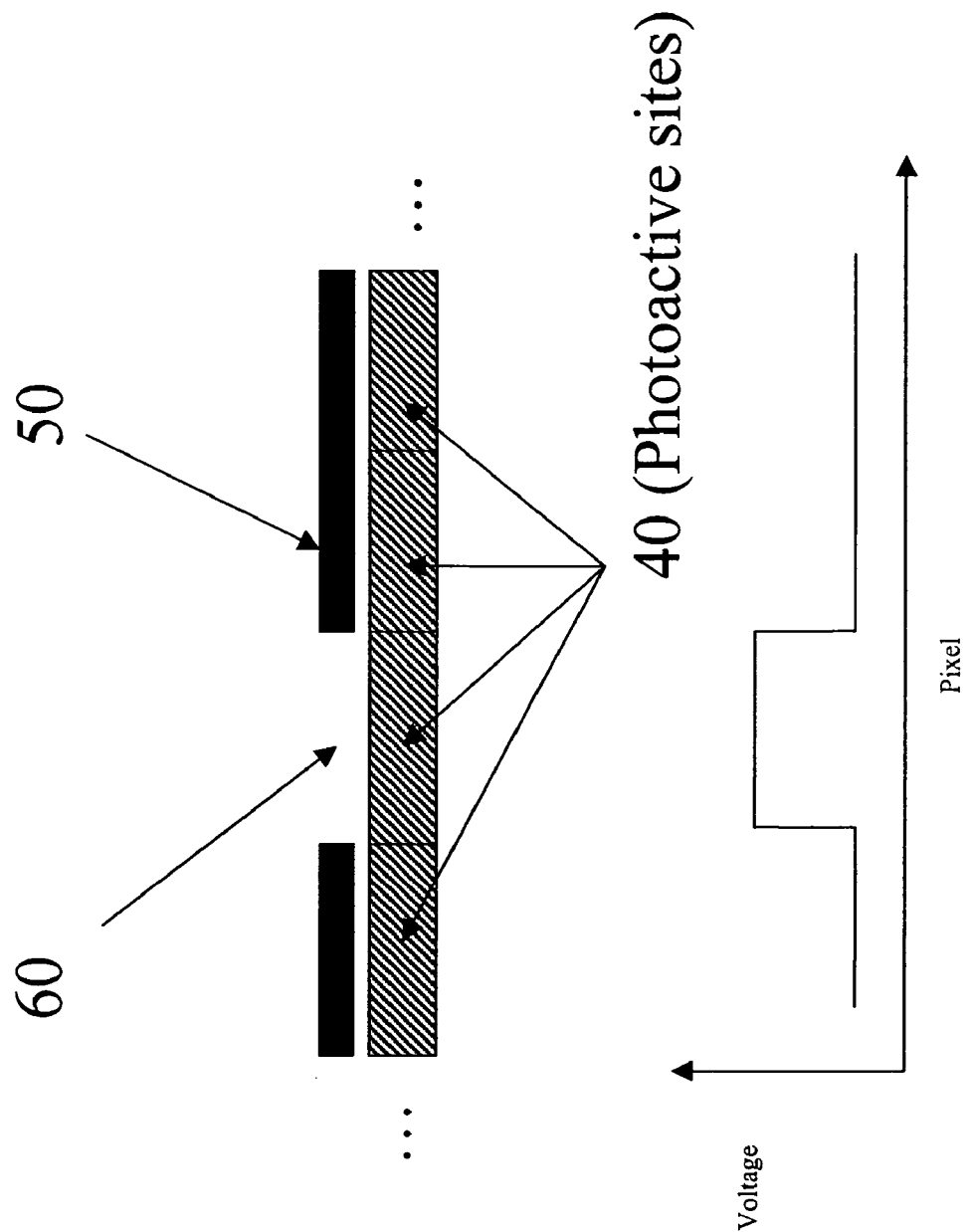
FIG. 2 is a side view of the sensor having a plate with apertures therein for embedding a signal therein.
Figure 3:
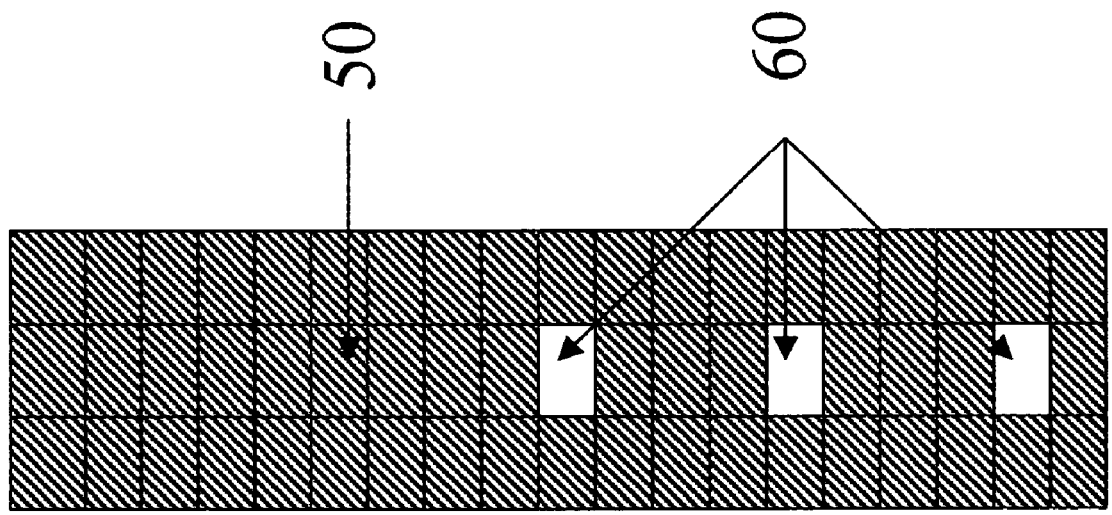
FIG. 3 is a top view of FIG. 2.

The substrate 20 is then exposed to light for embedding a signal in the non-active area 40. As illustrated in the graph of FIG. 2, this induces a predetermined voltage at each location that is exposed to light so that an "on state" is produced at the exposed locations and an "off state" is produced at all other locations in the non-active area. As stated above, this unique code or combination of "on" and "off" states can identify the particular wafer location of the sensor, manufacturer, lot, and/or wafer. It is noted that the embedded signal does not affect the active area so that the integrity of the image capture process is preserved.

Figure 5:
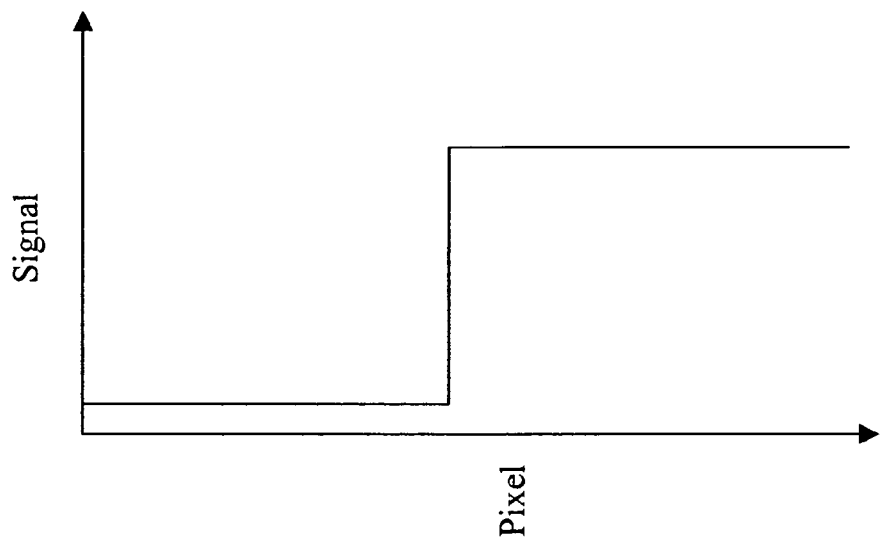
FIG. 5 is a graph illustrating signal coding of the alternative embodiment.
Figure 4:
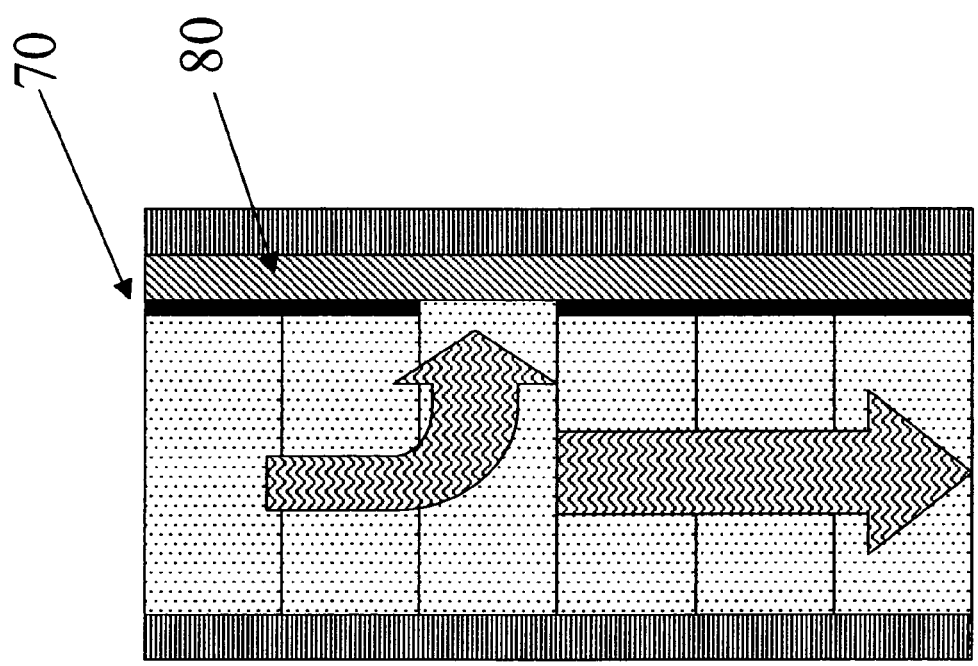
FIG. 4 is an alternative embodiment of FIG. 3.

Referring to FIG. 4, there is shown an alternative embodiment of coding an image sensor. In this case, the entire non-active area is exposed to light or "on" as illustrated in FIG. 5. In this embodiment, a portion of the buried channel 70 is removed in the non-active area 40. This permits charge from area above the removed buried channel to be dumped into the lateral overflow drain 80. This effectively creates a partially dead column. The start position of the dead column uniquely identifies the embedded information.

Figure 6:
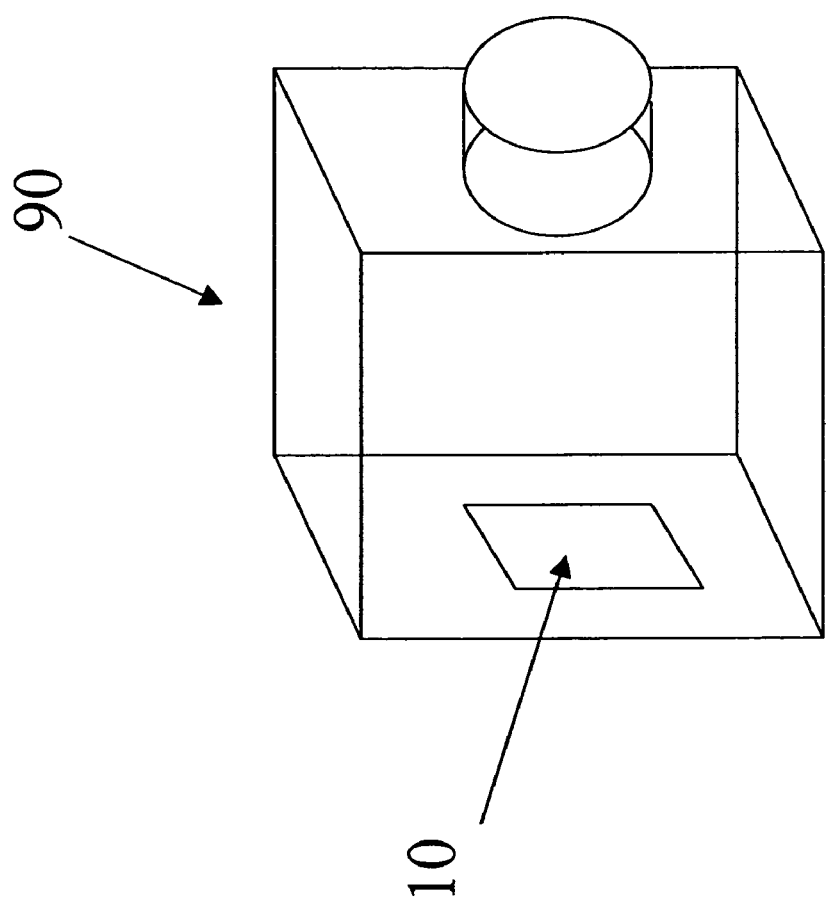
FIG. 6 is a perspective view of a digital camera.

Referring to FIG. 6, there is shown a digital camera 90 for implementing the sensor of the present invention into a commercial embodiment to which an ordinary consumer is accustomed.

The invention has been described with reference to a preferred embodiment. However, it will be appreciated that variations and modifications can be effected by a person of ordinary skill in the art without departing from the scope of the invention.

Parts List 10 image sensor
20 substrate
30 pixels/active area
40 non-active area
50 metal plate
60 apertures or openings
70 buried channel
80 lateral overflow drain
90 digital camera

What is claimed is:

1. An image sensor, comprising:
   a plurality of photosensitive sites arranged into an active area and a non-active area, wherein the photosensitive sites in the active area are used to capture an image; and
   a metal plate covering at least a portion of the photosensitive sites in the non-active area, wherein the metal plate includes one or more openings positioned at predetermined locations over respective photosensitive sites in the non-active area to form a unique pattern that is associated with the image sensor.

2. The image sensor of claim 1, wherein the one or more openings positioned at predetermined locations over respective photosensitive sites in the non-active area provides for electronic identification of the image sensor without affecting an image captured by the plurality of photosensitive sites in the active area.

3. The image sensor of claim 1, wherein the unique pattern of one or more openings identifies individually or in any combination a particular manufacturer, a lot, a wafer, and a location of the image sensor on the wafer.

4. The image sensor of claim 1, wherein the image sensor is included in an image capture device.

* * * * *